United States Patent
Fang et al.

[11] Patent Number: 5,838,034
[45] Date of Patent: Nov. 17, 1998

[54] INFRARED OPTICAL BULK CHANNEL FIELD EFFECT TRANSISTOR FOR GREATER EFFECTIVENESS

[75] Inventors: Yean-Kuen Fang; Fu-Yuan Chen, both of Tainan; Jiann-Ruey Chen, Hsinchu, all of Taiwan

[73] Assignee: National Science Council, Taipei, Taiwan

[21] Appl. No.: 762,961

[22] Filed: Dec. 10, 1996

[51] Int. Cl.⁶ .............................. H01L 29/04; H01L 29/78
[52] U.S. Cl. .................... 257/295; 257/462; 257/294; 438/57; 438/69; 438/3
[58] Field of Search ................... 257/295, 216, 257/217, 294, 462; 438/57, 69, 3

[56] References Cited

U.S. PATENT DOCUMENTS

| | | | |
|---|---|---|---|
| 4,074,302 | 2/1978 | Brewer | 257/24 |
| 4,245,230 | 1/1981 | Kwok et al. | 257/216 |
| 4,598,305 | 7/1986 | Chiang et al. | 257/216 |
| 4,814,844 | 3/1989 | Bluzer | 257/24 |
| 4,865,427 | 9/1989 | Kingston et al. | 350/355 |
| 5,189,593 | 2/1993 | Ooi | 257/295 |
| 5,248,564 | 9/1993 | Ramesh | 257/295 |
| 5,331,187 | 7/1994 | Ogawa | 257/295 |
| 5,418,389 | 5/1995 | Watanabe | 257/295 |
| 5,449,935 | 9/1995 | Nakamura | 257/295 |
| 5,502,488 | 3/1996 | Nagasaki et al. | 348/300 |
| 5,515,311 | 5/1996 | Mihara | 257/295 |
| 5,548,475 | 8/1996 | Ushikubo et al. | 257/295 |
| 5,567,979 | 10/1996 | Nashimoto et al. | 257/627 |
| 5,572,052 | 11/1996 | Kashihara et al. | 257/295 |
| 5,623,439 | 4/1997 | Gotoh et al. | 257/295 |

FOREIGN PATENT DOCUMENTS

| | | | |
|---|---|---|---|
| 361097871 | 5/1986 | Japan | 257/217 |
| 362004370 | 1/1987 | Japan | 257/295 |
| 405235268 | 9/1993 | Japan | 257/295 |
| 406021477 | 1/1994 | Japan | 257/295 |

OTHER PUBLICATIONS

Chen, et al., An infrared optical field transistor with high speed response, Appl. Phys. Lett. 68(3), pp. 1–2, Jan. 1996.

"Matsushita Uses $PbTiO_3$ Thin Film for High Response Speed Pyroelectric IR Imager." Nikkei Electronics Asia, pp. 36–37, Jan. 1993.

*Primary Examiner*—Donald Monin
*Attorney, Agent, or Firm*—Beveridge, DeGrandi, Weilacher and Young, LLP

[57] ABSTRACT

An infrared optical field effect transistor has been developed using a thin film of Lead Titanate ($PbTiO_3$) deposited on a $n/p^+$ Si substrate by RF magnetron sputtering. This transistor possesses excellent pyroelectric properties and can, therefore, be operated even at room temperature. The infrared optical field effect transistor has the following features associated with rapid bulk channel structure and higher mobility:

1. Can be operated at room temperature, unlike quantum type IR sensors which can only operate at very low temperature (−100° C.~−200° C.), which results in higher costs.
2. High speed response with only 2.3 $\mu s$ of rise time. This is much faster than other types of thermal infrared optical field effect transistors.
3. Easy to fabricate an integrated sensor device.

8 Claims, 6 Drawing Sheets

Rise(2)=2.325 μs        Fall(2)=5.375 μs

505

INFRARED OPTICAL BULK CHANNEL FIELD EFFECT TRANSISTOR FOR GREATER EFFECTIVENESS

FIELD OF INDUSTRIAL APPLICATIONS

This "high speed infrared optical field effect transistor (FET)" uses titanic acid lead to form the ferroelectric thin film. Its design incorporates the high mobility of high speed bulk channel field effect transistors for greater effectiveness. The sensor has a wide range of applications including scientific, commercial and military applications, including laser detection, missile guidance, spectrum analysis, remote control, burglar alarm and thermoimage detection.

TECHNICAL BACKGROUND OF THE INVENTION

There are two main types of infrared sensor. 1) Thermoelectric sensors, and 2) quantum sensors. Thermoelectric sensors are superior to quantum sensors because:

1. They are able to operate at room temperature; Quantum sensors require a low temperature environment between −100° C.∼−200° C. to operate.
2. Rapid response; Response time for thermoelectric sensors is faster than that for Golay cells (see Computers & Telecommunications, Volume 21, p.265, M. Okuyama, 1985).

Referring to Addison Wesely (John P. Uyemura, p. 21 Chapter 1) reveals that traditional thermoelectric FETs which use surface channel designs suffer from scattering on the transistor surface and traps created during fabrication which reduce mobility.

According to M. Okuyama (Computers & Telecommunications and Ferroelectrics volume 63, p.243, 1985), the rise time of traditional thermoelectric FETs is 3.5 $\mu$S and electrical current is less than 1 $\mu$A. As direct switching is not possible, an amplifier is required, which delays switching time.

SUMMARY OF THE INVENTION

The main purpose of this invention is to provide a high speed and sensitive infrared optical FET that operates at room temperature, in this case by using rapid bulk channel structure of metal/ferroelectric thin film/semiconductor. The second purpose is to accommodate fabrication of VLSI for infrared optical FET which can also be developed as integrated IR OEIC.

The use of surface channels in conventional thermoelectric FETs is the reason behind their lower mobility and slower switching time. The inventor discovered that bulk channels can reduce equivalent resistance; furthermore, infrared rays cause compensatory charge variation in the depletion layer of components; this compensatory change is equivalent of its ferroelectric capacitance series with depletion capacitance. The compensatory charge variation of traditional surface channel FET is located at the inversion layer, and equivalent capacitance is only ferroelectric capacitance. According to the comparative method found in Physics of Semiconductor Devices(S. M. Sze, 1981),the developed infrared sensors using ferroelectric thin film will have lower equivalent capacitance.

Because the developed infrared optical FETs using Ferroelectric thin film have lower resistance and capacitance, response speed is faster than that of conventional FETs. Additionally, its electrical current is significantly increased to reach above 100 $\mu$A, making it more sensitive.

BRIEF DESCRIPTION OF THE DRAWINGS

1. . . . source
2. . . . gate
3. . . . drain
4. . . . p-n Si semiconductor
5. . . . ferroelectric thin film
6. . . . substrate

Infrared intensities are 0 $\mu$W, 200 $\mu$W, 500 $\mu$W, 800 $\mu$W in an upward progression.
vertical axis: 50 $\mu$A/div,
horizontal axis: 0.8 V/div

"Id,dark" indicates drain dark current;
"Id" indicates drain current.

Figure 4:
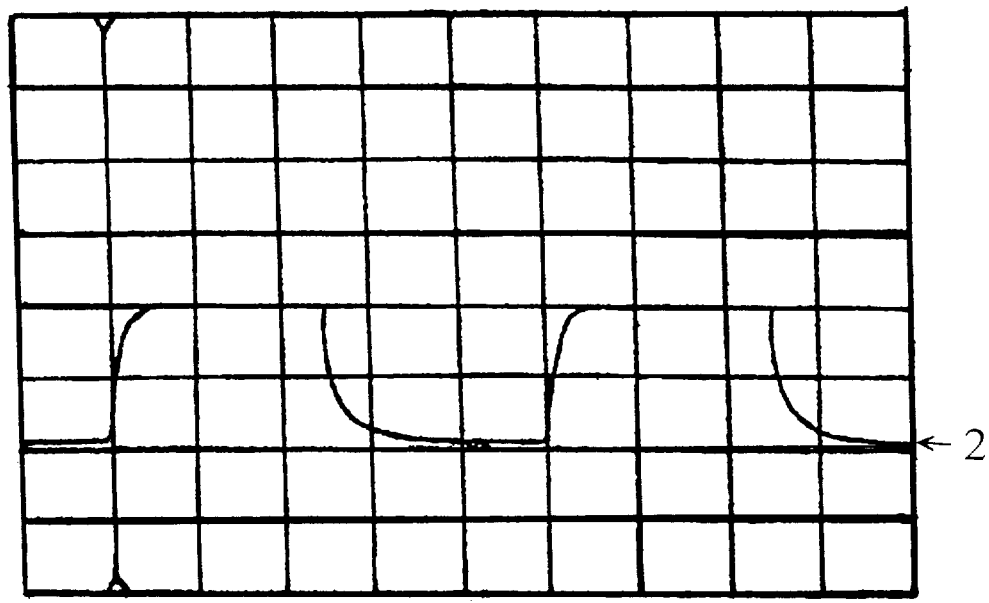

FIG. 4 depicts time response of bulk channel infrared optical FET vertical axis: 1 V/div;
horizontal axis: 10 $\mu$s/div FIG. 5 depicts after polar process, energy band at junction of ferroelectric thin film and semiconductor.

(a) unexposed (b) exposed
501 . . . ferroelectric
502 . . . n layer
503 . . . Ec
504 . . . Ev
505 . . . Depletion layer

DETAILED DESCRIPTION OF THE INVENTION

Figure 1:
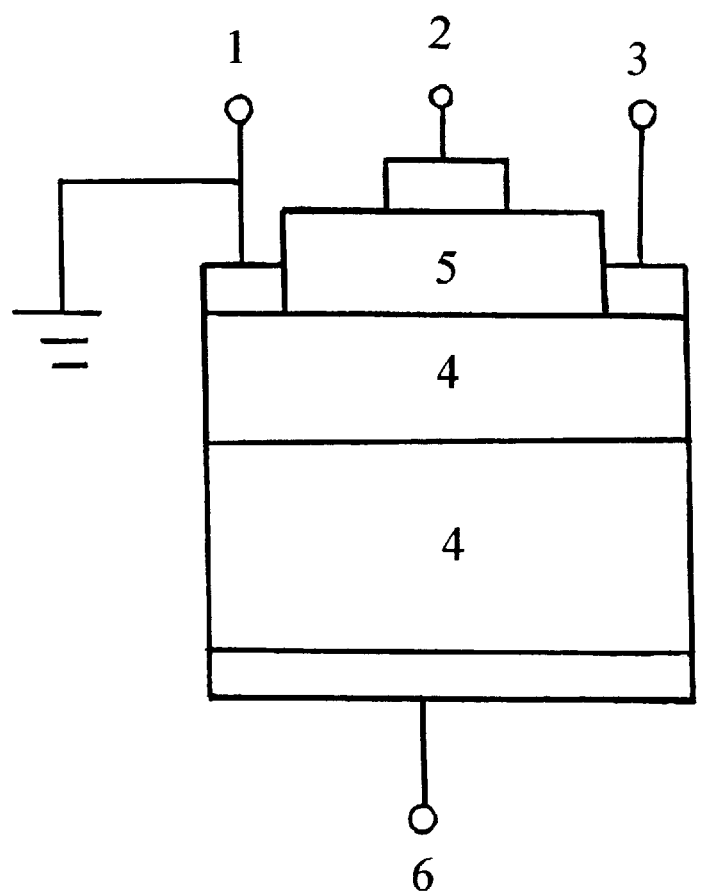
FIG. 1 depicts structure of bulk channel infrared optical FET

The architecture of infrared optical FETs which use ferroelectric thin film (5) and p-n junction of Si semiconductor (4) is illustrated in FIG. 1. Ferroelectric thin film is put on the top of central Si semiconductor, then metal thin film is put on as gate (2). At either sides of the gate are the source (1) and the drain (3) of metal thin film. At the bottom of Si semiconductor is substrate of metal thin film.

The p-n junction of the Si semiconductor described above can be either n/p+ or p/n$^+$. The substrate generally adopts semiconductor materials such as Si of IV family, CdS of II–VI family and GaAs of III–V family. Ferroelectric thin film (5) is used to sense infrared ray, and the gate is used as the radiation absorbing electrode.

Fabrication Procedure:

1. Clean the Si semiconductor substrate.
2. Ferroelectric thin film grows on Si semiconductor by using RF magnetron sputtering system.
3. Evaporate a gate of metal thin film on ferroelectric thin film.
4. Etch ferroelectric thin film by using photolithography to open source and drain windows.
5. Evaporate source and drain on either side of ferroelectric thin film.
6. Evaporate a substrate electrode on the other side of Si semiconductor. An infrared sensor of ferroelectric thin film is now complete.

The diameter of the target is 5 cm, the distance between target and substrate is 5 cm, growing power is 100 W, sputtering gas is mix of 90% Ar and 10% oxygen, growing pressure is 6 mtorr, temperature of substrate is 500° C. to 600° C., growing method of ferroelectric thin film can be either RF magnetron sputtering or laser evaporation.

Because ferroelectric thin film with good thermoelectric characteristics can be operated at room temperature, infrared sensors using ferroelectric thin film have the following features:

1. Able to operate at room temperature. It overcomes the necessity of low temperature devices for traditional quantum infrared sensors which can only operate in a −100° C.~−200° C. environment. This greatly reduces production costs.
2. Rapid response superior to that of other thermoelectric infrared optical FETs; rise time of only 2.3 $\mu$S.
3. It is easier to manufacture components for integrated infrared sensor.

COMPONENT CHARACTERISTICS TEST

Figure 2:
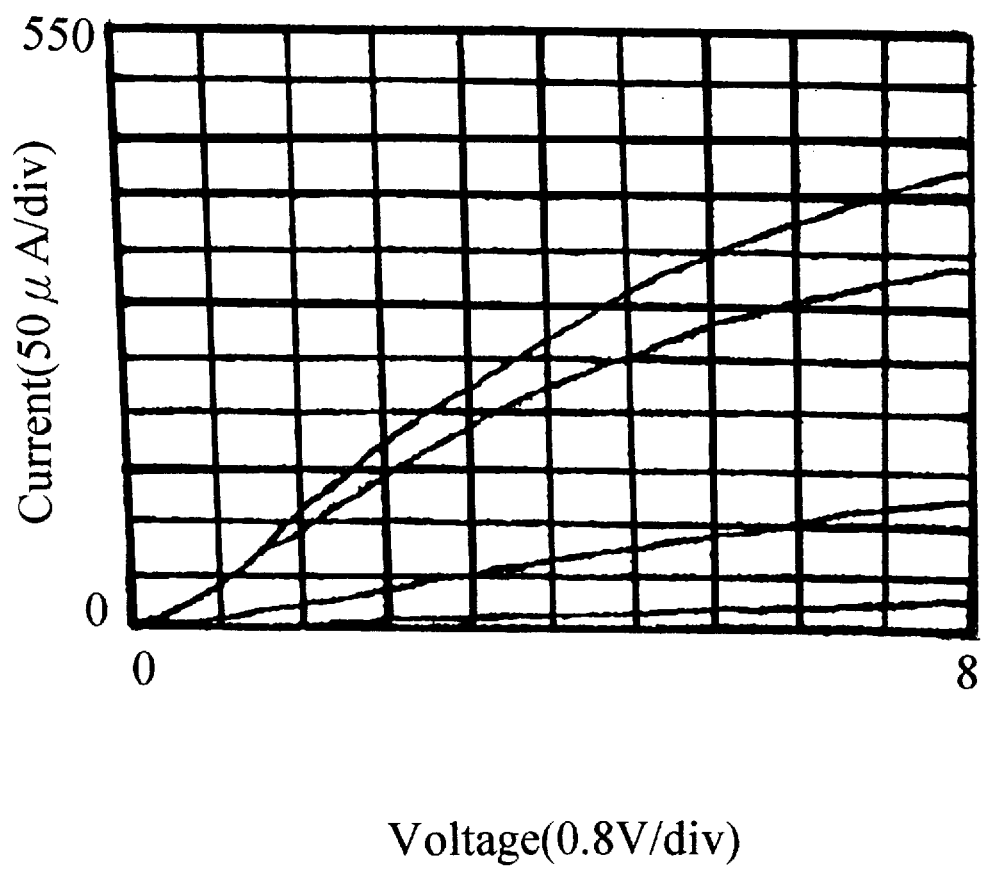
FIG. 2 depicts drain current/drain voltage curve with different infrared intensities.
Figure 3:
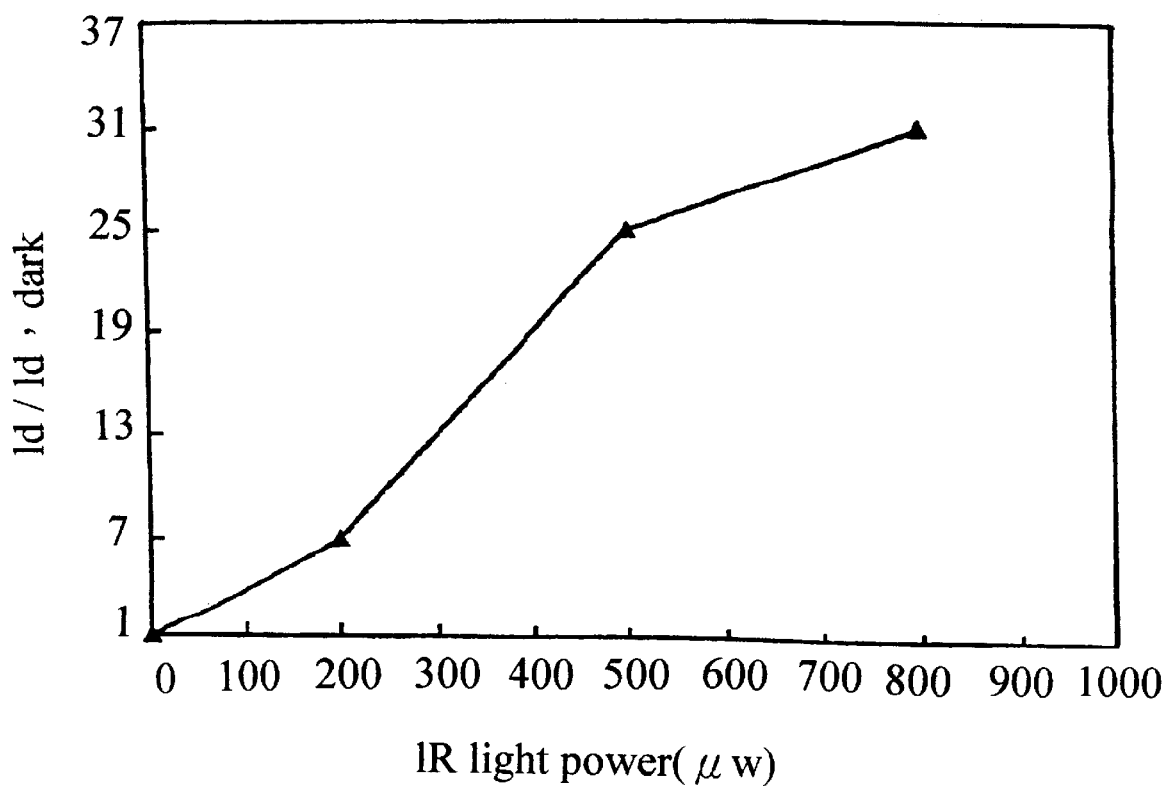
FIG. 3 depicts effect of drain current with different infrared intensities.

Current/voltage curve is measured using the HP 4145B semiconductor parameter analyzer; response time is measured using the HP 54600A oscilloscope with an IR LED (wavelength of 970 nm) light source. FIG. 2 illustrates typical drain current/voltage curve of ferroelectric thin film infrared optical FET with different infrared intensities. FIG. 3 shows effect of drain current using different infrared intensities. FIG. 2 and FIG. 3 show that drain current increases as infrared intensity increases. FIG. 4 shows loading waveform which is measured using the HP 54600A oscilloscope. An infrared ray is used to irradiate the sensor to generate the current waveform.

FUNCTIONS

We can see from the above that the invention has the following functions:

1. Although the quantum infrared sensor has a faster response time, it must operate in a −100° C.~−200° C. environment to inhibit noise. This can increase costs substantially. The optical field effect transistor has not only an excellent response time, but can also be operated at room temperature. No low temperature devices are needed.
2. Its high rapid response, with a rise time of only 2.3 $\mu$S, exceeds other thermoelectric infrared optical FETs.
3. It is easier to produce components for an integrated infrared sensor.

The explanation is made by a physical example with illustrations, which are intended to aid comprehension.

EXAMPLE

Figure 5A:
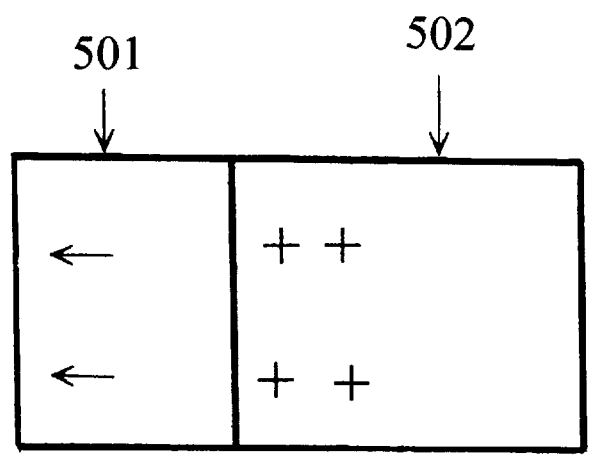
Figure 5A:
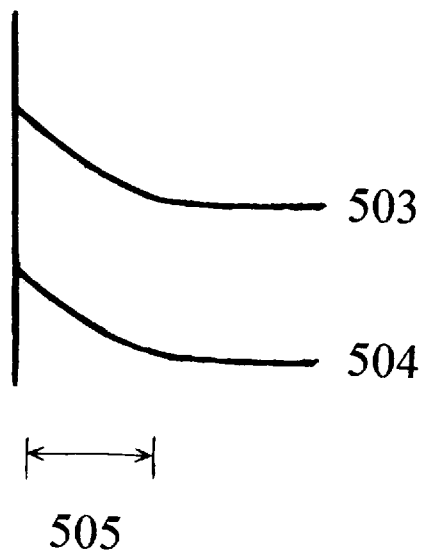
Figure 5B:
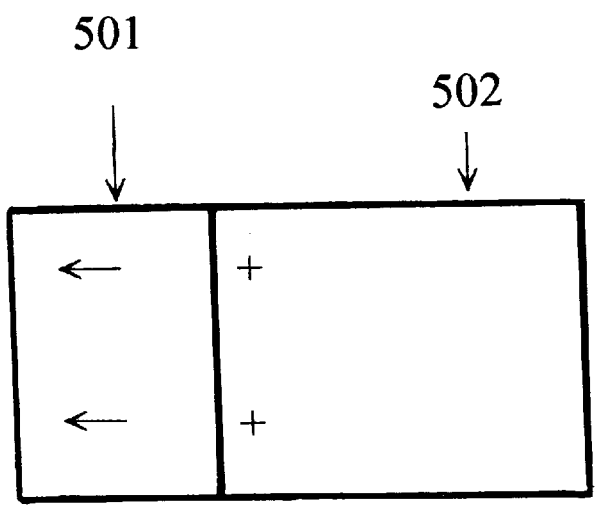
Figure 5B:
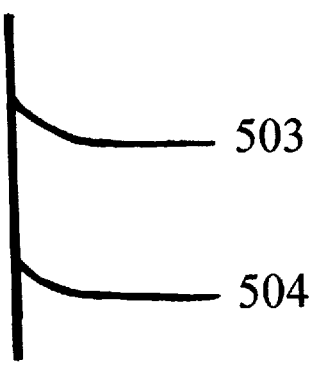
Figure 5B:
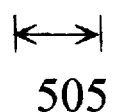

The sensor is able to be operated in depletion mode after it is processed by polarization, at 200° C., with −8 V on gate about 20 minutes. After the polarization process, remanent polarization of the ferroelectric thin film generates an electrical field. The electrical field repels electrons in the n layer and creates a depletion region which has a positive charge. The energy band of semiconductor will bend upward as shown in FIG. 5(a). When the sensor is exposed to infrared radiation, the ferroelectric thin film absorbs it, causing a rise in temperature, weakening the polarization. The depletion region becomes narrow; the n type channel and drain conductance increase. Its energy band is shown in FIG. 5(b).

From the above description, an optical field effect transistor (FET) with high speed infrared response which uses titanic acid lead for its ferroelectric thin film is a real innovation.

What claims is:

1. An infrared optical bulk channel field effect transistor, comprising:
    a first semiconductor layer;
    a second semiconductor layer provided on the first semiconductor layer, the first semiconductor layer and the second semiconductor layer together forming a p-n junction;
    a source electrode provided on a source portion of the second semiconductor layer;
    a drain electrode provided on a drain portion of the second semiconductor layer;
    a layer of ferroelectric material provided on a gate portion of the second semiconductor layer, the layer of ferroelectric material having thermoelectric properties and being polarized such that the layer of ferroelectric material produces a depletion region in at least the second semiconductor layer which varies in size with a temperature of the ferroelectric material; and
    a gate electrode provided on the layer of ferroelectric material.

2. An infrared optical bulk channel field effect transistor as recited in claim 1, wherein the layer of ferroelectric material is formed from titanic acid lead or PZT.

3. An infrared optical bulk channel field effect transistor as recited in claim 1, wherein the first semiconductor layer and the second semiconductor layer are formed from a member of the group consisting of Si, CdS, and GaAs.

4. An infrared optical bulk channel field effect transistor as recited in claim 1, wherein the gate electrode is formed of Au or Cr.

5. An infrared optical bulk channel field effect transistor as recited in claim 1, further including an electrode provided on a side of the first semiconductor layer opposite the second semiconductor layer.

6. A method of fabricating an infrared optical bulk channel field effect transistor as recited in claim 1, comprising:
    providing a second semiconductor layer on the first semiconductor layer, such that the first semiconductor layer and the second semiconductor layer together form a p-n junction;
    providing a layer of ferroelectric material on at least a portion of the second semiconductor layer;
    forming a thin metal film on at least a portion of the layer of ferroelectric material;
    etching the layer of ferroelectric material, so as to form at least one open source window to the second semiconductor layer, at least one open drain window to the second semiconductor layer, and a gate electrode on the layer of ferroelectric material;
    forming a source electrode at the open source window on a first side of the gate electrode;
    forming a drain electrode at the open drain window on a second side of the gate electrode opposite the first side;
    forming a substrate electrode on a side of the first semiconductor layer opposite the second semiconductor layer; and
    poling the layer of ferroelectric material such that the layer of ferroelectric material produces a depletion region in at least the second semiconductor layer which varies in size with a temperature of the ferroelectric material.

7. A method of fabricating an infrared optical bulk channel field effect transistor as recited in claim 6, wherein the poling of the layer of ferroelectric material includes:

subjecting the infrared bulk channel field effect transistor to a temperature of 200° C. while applying a voltage of −8 V to the gate electrode for about 20 minutes.

8. A method of fabricating an infrared optical bulk channel field effect transistor as recited in claim 6, wherein the layer of ferroelectric material is grown on the second semiconductor layer by RF magnetron sputtering or laser evaporation.

* * * * *